(12) United States Patent
Kruglick

(10) Patent No.: US 9,612,169 B2
(45) Date of Patent: *Apr. 4, 2017

(54) METHODS, SYSTEMS, AND DEVICES FOR CALCULATING TEMPERATURE CHANGE OF AN ELECTROCALORIC EFFECT MATERIAL

(71) Applicant: EMPIRE TECHNOLOGY DEVELOPMENT, LLC, Wilmington, DE (US)

(72) Inventor: Ezekiel Kruglick, San Diego, CA (US)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 238 days.

This patent is subject to a terminal disclaimer.

(21) Appl. No.: 14/303,326

(22) Filed: Jun. 12, 2014

(65) Prior Publication Data

US 2014/0294037 A1    Oct. 2, 2014

Related U.S. Application Data

(62) Division of application No. 12/999,461, filed as application No. PCT/US2010/046486 on Aug. 24, 2010, now Pat. No. 8,760,177.

(51) Int. Cl.
| | | |
|---|---|---|
| *G01K 17/00* | (2006.01) | |
| *H01L 37/02* | (2006.01) | |
| *G01R 27/26* | (2006.01) | |

(52) U.S. Cl.
CPC ......... *G01K 17/00* (2013.01); *G01R 27/2605* (2013.01); *H01L 37/02* (2013.01); *F25B 2321/001* (2013.01); *G01R 27/26* (2013.01)

(58) Field of Classification Search
CPC ..................................................... G01K 17/00
See application file for complete search history.

(56) References Cited

U.S. PATENT DOCUMENTS

| | | | |
|---|---|---|---|
| 3,638,440 A | 2/1972 | Lawless | |
| 5,113,117 A | 5/1992 | Brooks et al. | |
| 5,172,065 A | 12/1992 | Wallrafen | |
| 6,534,767 B1 * | 3/2003 | Di Maio ................ | G01K 7/343 |
| | | | 250/338.2 |
| 8,035,274 B2 | 10/2011 | Erbil et al. | |

(Continued)

FOREIGN PATENT DOCUMENTS

GB    2420662 A    5/2006

OTHER PUBLICATIONS

"Electrocaloric effect", http://en.wikipedia.org/wiki/Electrocaloric_effect, access date: Jan. 29, 2010, pp. 1.

(Continued)

*Primary Examiner* — Jeff Natalini
(74) *Attorney, Agent, or Firm* — Xinova, LLC

(57) ABSTRACT

Examples are generally described that include monitoring an electrocaloric effect device. A varying voltage may he applied across an electrocaloric effect material. A capacitance change of the electrocaloric effect material at least in part responsive to the varying voltage may be measured. A temperature change of the electrocaloric effect material may be calculated based, at least in part, on the capacitance change.

7 Claims, 6 Drawing Sheets

(56) References Cited

U.S. PATENT DOCUMENTS

| | | |
|---|---|---|
| 2002/0176273 A1 | 11/2002 | Kang et al. |
| 2005/0122639 A1 | 6/2005 | Okamatsu et al. |
| 2005/0122785 A1* | 6/2005 | Umeda ................ G06K 9/0002 365/187 |
| 2012/0049867 A1 | 3/2012 | Kruglick |

OTHER PUBLICATIONS

International Search Report dated Nov. 8, 2010 for Application No. PCT/US2010/046486.
"Thermal Rectification", http://thermalhub.org/topics/ThermalRectification, access date: Jan. 29, 2010, pp. 1-2.
Ashley, S., "Cool Polymers: Toward the Microwave Oven Version of the Refrigerator", Scientific American Magazine, Printed Apr. 7, 2009 from Internet http://www.sciam.com/article.cfm?id=cool-polymers&print=true>, Oct. 30, 2008, pp. 1-2.
Mischenko, A. et al., "Giant Electrocaloric Effect in Thin-Film PbZr0.95Ti0.05O3", Science, vol. 311, Downloaded from Internet on Oct. 21, 2009 <http://www.sciencemag.org>, Mar. 3, 2006, pp. 1270-1271.
Neese, B. et al., "Large Electrocaloric Effect in Ferroelectric Polymers Near Room Temperature", Science vol. 321, Downloaded from Internet on Apr. 7, 2009 <http://www.sciencemag.org>, Aug. 8, 2008, pp. 821-823.
Vereshchagina, Elizaveta , "Investigation of Solid-State Coller Based on Electrocaloric Effect", Thesis for the degree of Master of Science in Technology, 2007, 130 pages, Retrieved from internet: https://www.doria.fi/bitstream/handle/10024/30225/TMP.objres.599.pdf?sequence=1, May 2007, pp. 124-125.
Mischenko, et al., "Giant electrocaloric effect in the thin film relaxor ferroelectric 0.9 PbMg1/3Nb2/3O3-0.1 PbTiO3 near room temperature", Applied Physics Letters, vol. 89, Issue 24, pp. 1-3 (2006).

* cited by examiner

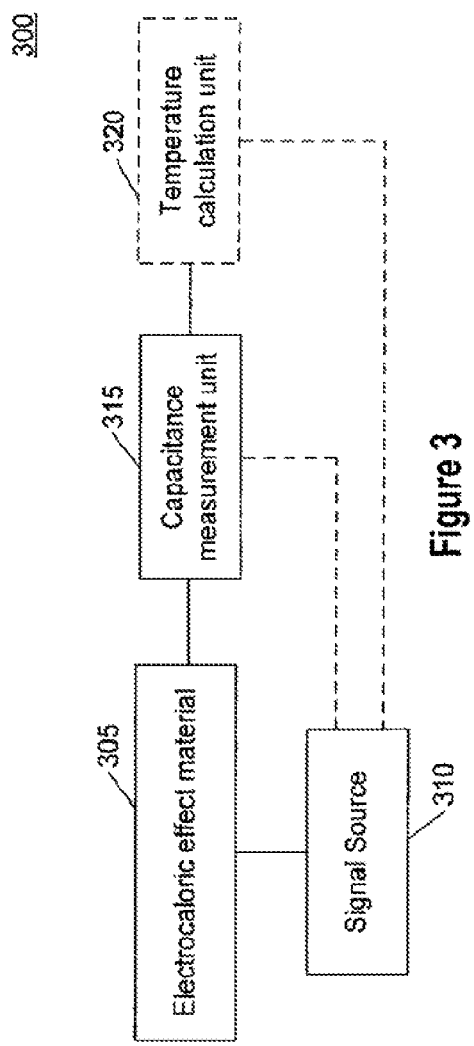
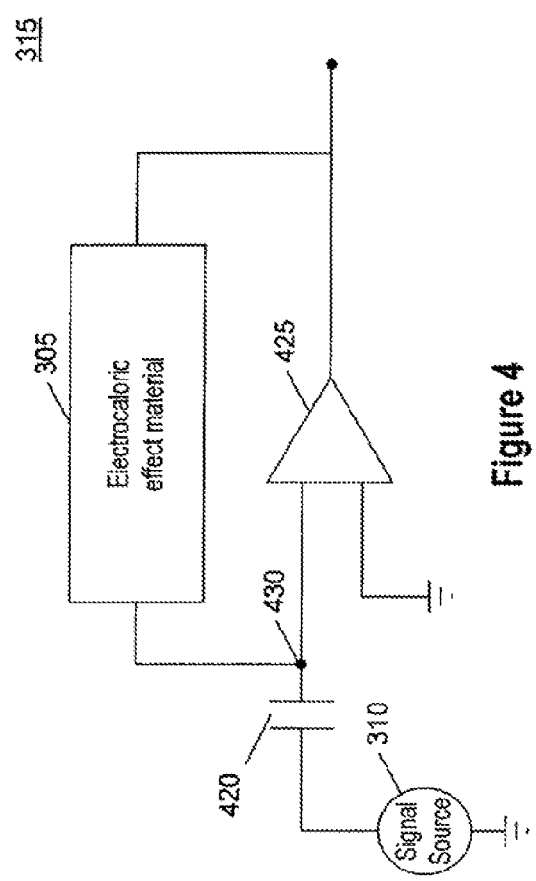
Figure 3
Figure 4

METHODS, SYSTEMS, AND DEVICES FOR CALCULATING TEMPERATURE CHANGE OF AN ELECTROCALORIC EFFECT MATERIAL

CROSS-REFERENCE TO RELATED APPLICATION

This application is a divisional under 35 U.S.C. § 121 of U.S. patent application Ser. No. 12/999,461, filed on Dec. 16, 2010, now U.S. Pat. No. 8,760,177, which is a U.S. national phase filing of PCT Application No. PCT/US2010/046486 filed on Aug. 24, 2010. These applications are incorporated herein by reference in their entirety and for any purpose.

BACKGROUND

Electrocaloric effect materials are materials that exhibit a change in temperature of the material responsive to an electric field. Without being bound by theory, the electrocaloric effect may be due in part to the electric field causing a changed entropy capacity in the material. The application of an electric field may, for example, change a number of available entropy states, causing atoms of the material to vibrate at a higher temperature, raising the temperature of the material, Electrocaloric effect materials include lead zirconate titanate and some polymers, among other electrocaloric effect materials. Electrocaloric effect materials may he used in electrocaloric effect devices, which may be used in cooling systems or heat pumps.

The temperature of an electrocaloric effect material may be monitored to observe or verify the performance of the material. Temperature sensors have been placed on either side of an electrocaloric effect material in order to measure the material's temperature changes and monitor the performance of the material.

Unless otherwise indicated herein, the materials described in this section are not prior art to the claims in this application and are not admitted to be prior art by inclusion in this section.

SUMMARY

Techniques are generally described that include methods, systems, and/or devices. Some examples methods include methods of monitoring an electrocaloric effect material. A method may include applying a varying voltage across the electrocaloric effect material, measuring a capacitance change of the electrocaloric effect material at least in part responsive to the varying voltage, and calculating a temperature change of the electrocaloric effect material based, at least in part, on the capacitance change.

Some example electrocaloric effect systems include an electrocaloric effect material, a signal source, and a capacitance measurement unit. The signal source may be positioned to apply a varying voltage across the electrocaloric effect material. The capacitance measurement unit may be coupled to the electrocaloric effect material and configured to generate a signal indicative of a change in capacitance of the electrocaloric effect material responsive to the varying voltage.

Some example capacitance measurement units may include an electrocaloric effect material, a reference capacitor, a signal source, and an amplifier. The reference capacitor may be coupled to the electrocaloric effect material. The signal source may be configured to apply a varying voltage across the capacitor and the electrocaloric effect material. The amplifier may be coupled to a node between the reference capacitor and the electrocaloric effect material, and the amplifier may be configured to amplify a voltage at the node.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several examples in accordance with the disclosure and are, therefore, not to be considered limiting of its scope, the disclosure will be described with additional specificity and detail through use of the accompanying, drawings, in which:

In the drawings:

FIG. 3 is a schematic illustration of an electrocaloric effect system arranged in accordance with at least some examples of the present disclosure;

FIG. 4 is a block diagram illustrating an example capacitance measure measurement unit arranged for capacitance measurement in accordance with at least some examples of the present disclosure;

DETAILED DESCRIPTION

Figure 1:
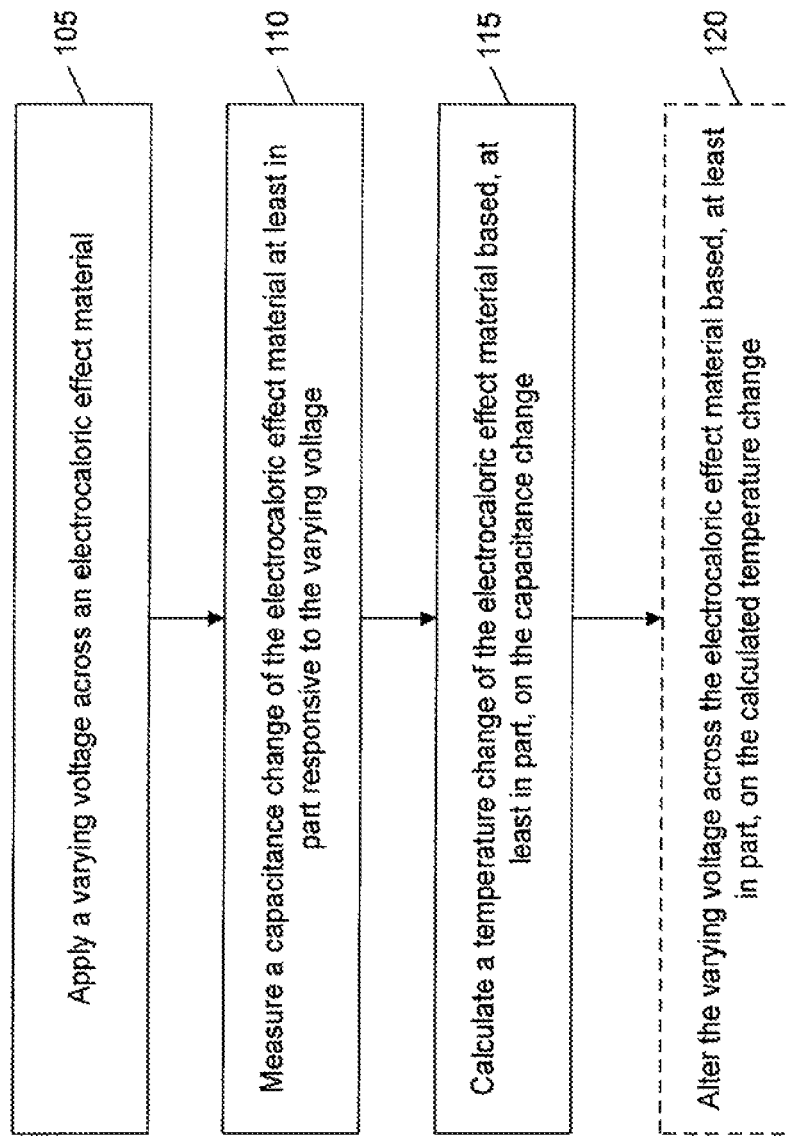
FIG. 1 is a flowchart illustrating an example of a method for monitoring an electrocaloric effect device in accordance with at least some examples of the present disclosure.

In the following detailed description, reference is made to the accompanying drawings, which form a part hereof In the drawings, similar symbols typically identify similar components, unless context dictates otherwise. The illustrative examples described in the detailed description, drawings, and claims are not meant to be limiting. Other examples may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in as wide variety of different configurations, all of which are implicitly contemplated herein.

This disclosure is drawn, inter alia, to methods, systems, devices, and/or apparatus generally related to monitoring an electrocaloric effect material. A varying voltage may be applied across an electrocaloric effect material. A capacitance change of the electrocaloric effect material at least in part responsive to the varying voltage may be measured. A temperature change of the electrocaloric effect material may be calculated based, at east in part, on the capacitance change.

FIG. 1 is a flowchart illustrating an example of a method for monitoring an electrocaloric effect device. In block 105, a varying voltage is applied across an electrocaloric effect material, In block 110, a capacitance change of the electrocaloric effect material occurring at least in part responsive to the varying voltage may be measured. In block 115, a temperature change of the electrocaloric effect material may be calculated based, at least in part, on the capacitance change. In block 120, the varying voltage applied to the electrocaloric effect material may be altered based, at least in part, on the calculated temperature change.

In block 105, a varying voltage is applied across the electrocaloric effect material. Any electrocaloric effect materials may be monitored in accordance with examples described herein, including lead zirconate titanate, electrocaloric effect polymers, and other electrocaloric effect materials. The varying voltage may vary continuously or discretely. For example, the varying voltage may include one or more voltage pulses between two reference voltages. The application of the varying voltage across the electrocaloric effect material may generate a varying electric field across the electrocaloric effect material, and may cause the electrocaloric effect material to change temperature.

In block 110, a capacitance change of the electrocaloric effect material responsive to the varying voltage may be measured. Examples of suitable devices and systems for measuring the capacitance of the electrocaloric effect material may be described further below. In some examples, the capacitance of the electrocaloric effect material may be measured by comparing the capacitance of the electrocaloric effect material with a reference capacitor.

In block 115, a temperature change of the electrocaloric effect material may be calculated based, at least in part, on the measured capacitance change. Examples of suitable devices and systems for calculating the temperature change may be described further below. The temperature change of an electrocaloric effect material may be related to the polarization of the material, where the polarization is a charge per area of the material. Polarization as a function of voltage in an electrocaloric effect material may be described, for example, in A. S. Mischenko et al., "Giant electrocaloric effect in thin-fim PbZr$_{0.95}$Ti$_{0.05}$O$_3$," *Science* 311, no. 5765 (Mar. 3, 2006): 1270-1271, which is hereby incorporated by reference in its entirety for any purpose. Capacitance per area, which is a change in charge per volt per area, may therefore be related to a slope of a polarization (with example units of measure μC*cm$^{-2}$) vs. electric field (with example units of measure kV*cm$^{-1}$) curve at a particular temperature.

A temperature change of an electrocaloric material may be described using the equation below, and as described in A. S. Mischenko et al., "Giant electrocaloric effect in thin-fim PbZr$_{0.95}$Ti$_{0.05}$O$_3$," *Science* 311, no. 5765 (Mar. 3, 2006): 1270-1271, which is hereby incorporated by reference in its entirety for any purpose.

$$\Delta T = K \int_{E1}^{E2} T \left( \frac{\partial P}{\partial T} \right)_E dE$$

where T is temperature, P is polarization. E is electric, field, and K is a constant determined by properties of the electrocaloric effect material, such as thermal capacity, density, and geometry of the material. As an example, taking a case where a voltage pulse is applied to an electrocaloric effect material from a starting reference voltage (considered zero in this example), the electric field across the electrocaloric effect material may be related to the applied voltage by a constant term (related to a thickness of the electrocaloric material between electrodes applying the varying voltage and a dielectric constant). These terms may be accordingly included in the constant K, and the above equation expressed in terms of voltage:

$$\Delta T = K \int_0^V T \left( \frac{\partial P}{\partial T} \right)_V dV$$

Accordingly, based on a varying input voltage, a temperature change may be determined based on a draftee in the polarization of the material.

Note also, that a capacitance of the electrocaloric effect material may he related to the polarization. For example:

$$C = \frac{\partial Q}{\partial V} = A \frac{\partial P}{\partial V}$$

where A represents a constant area of the electrocaloric effect material, and accordingly:

$$C = \frac{\partial Q}{\partial V} = K * \partial P$$

where K represents a constant based on electrocaloric effect material geometries and composition, and may not be the same K as described above. However, what is meant is that K is a material and geometry constant which may be predicted or calculated at a time of design of the electrocaloric effect device or characterized by testing after or during manufacture.

In this manner, it can be seen that capacitance and temperature change for a given voltage change may he related by a constant. Since capacitance may be measured, polarization may be obtained, and from polarization, the temperature change may be calculated.

In block 120, the varying voltage across the electrocaloric effect material may be altered based, at least in part, on the calculated temperature change. For example, if a particular input voltage difference generates a temperature change less than a threshold change or less than an expected amount, the applied voltage pulses may be increased in magnitude. As another example, if the input voltage difference generated a temperature change greater than a threshold or greater than an expected amount, the magnitude of the input voltage difference may be reduced.

Figure 2:
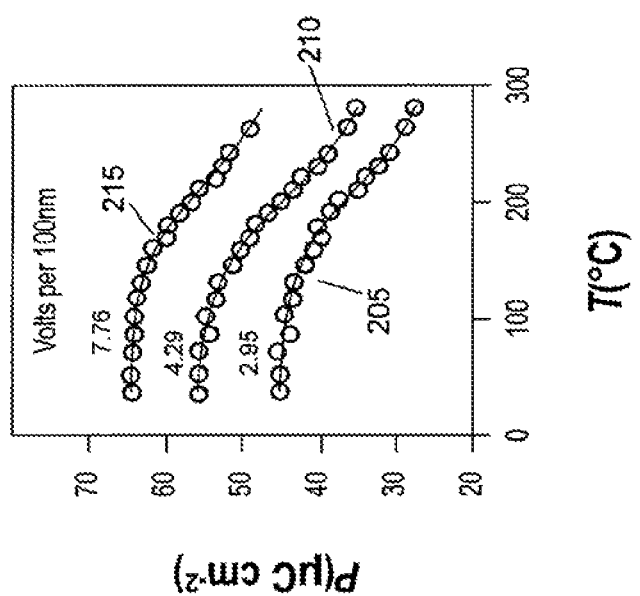
FIG. 2 is an example graph of polarization values versus temperature at a variety of applied voltages in accordance with at least some examples of the present disclosure.

FIG. 2 is an example graph of polarization values versus temperature at a variety of applied voltages. A data line 205 represents a voltage per 100 nm of thickness of electrocaloric effect material of 2.95 V. A data line 210 represents a voltage per 100 nm of thickness of electrocaloric effect material or 4.29 V. A data line 215 represents a voltage per 100 nm of thickness of electrocaloric effect material of 7.76. Looking at FIG. 2, it may be seen that a known voltage across an electrocaloric effect material, and a known polarization, may allow a calculation of temperature, examples of which have been described above.

FIG. 3 is a schematic illustration of an electrocaloric effect system 300. The electrocaloric effect system 300 includes electrocaloric effect material 305. A signal source 310 may be positioned to apply a varying voltage across the electrocaloric effect material 305. A capacitance measurement unit 315 may be coupled to the electrocaloric effect material 305, for example by integrated or external electrical connectors to one or more electrodes deposited on or otherwise in electrical communication with the electrocaloric effect material 305. The capacitance measurement unit 315 may be configured to generate a signal indicative of a change in capacitance of the electrocaloric effect material responsive to the varying voltage applied by the signal source 110. A temperature calculation unit 320 may be coupled to the capacitance measurement unit 315, for example by integrated or external electrical connectors coupled between electrodes or terminals of the capacitance measurement unit 315 and the temperature calculation unit 320. The temperature calculation unit 320 may be configured to receive the signal indicative of the change in capacitance of the electrocaloric effect material 305 and generate a signal indicative of a temperature change of the electrocaloric effect material 305 based, at least in part, on the change in capacitance measured by the capacitance measurement unit 315.

The electrocaloric effect material 305 may be implemented using any material exhibiting an electrocaloric effect, or combinations of materials exhibiting an electrocaloric effect. In some examples, the electrocaloric effect material 305 may be part of an electrocaloric device, such as a cooling system or heat pump. Electrodes may be provided for application of a voltage across the electrocaloric effect material 305 which may be in direct contact with the electrocaloric effect material 305 in some examples, but not in direct contact in other examples.

The signal source 310 may include a voltage source configured to apply a pulsed voltage across the electrocaloric effect material 305. Such a voltage source may be implemented using standard CMOS circuitry in some examples.

The capacitance measurement unit 315 may be implemented using any circuitry configured to measure capacitance. Examples of devices and systems for USC in the capacitance measurement unit 315 may be described further below. In some examples, the capacitance measurement unit 315 may compare a capacitance of the electrocaloric effect material 305 with a reference capacitance. In one example, the capacitance measurement unit 315 may be configured to measure a voltage at a node between the electrocaloric effect material 305 and a reference capacitor. In some examples, the capacitance measurement unit 315 may be coupled to the signal source 310, and may in some examples be in all or in part implemented in the signal source 310. That is, in some examples, the signal source 310 may include circuitry to apply one or more voltage pulses to the electrocaloric effect material 305. The circuitry for applying one or more voltage pulses to the electrocaloric effect material 305 may itself also be able to serve as the capacitance measurement unit 315, examples of which may be described further below.

The capacitance measurement unit 315 may generate a signal indicative of a change in capacitance of the electrocaloric effect material. The signal may include a capacitance measurement at two or more times, or the signal may be indicative of the difference between capacitance measurements at two or more times. The signal may be a real-time measurement of the capacitance of the electrocaloric effect material. In this manner, a signal generated by the capacitance measurement unit may be indicative of a change of capacitance of the electrocaloric effect material 305 responsive to a varying voltage applied by the signal source 310. The capacitance measurement unit 315 may be implemented in all or in part using available switched or chopped capacitance measurement circuits. Examples of capacitance measurement units may be described further below.

The temperature calculation unit 320 may receive the signal indicative of the change in capacitance of the electrocaloric elect material and generate a signal indicative of a temperature change of the electrocaloric effect material. That is, based on one or more capacitance values, or an indication of a capacitance change, the temperature calculation unit 320 may calculate a corresponding temperature change in accordance with the examples of temperature calculation described above. The temperature calculation unit 320 may calculate a change in polarization of the electrocaloric effect material based, at least in part, on the signal indicative of the change in capacitance received from the capacitance measurement unit 315.

In some examples, the temperature calculation unit 320 may be coupled to the signal source 310, for example by integrated or external electrical connectors coupled between electrodes or terminals of the temperature calculation unit 320 and the signal source 310. The signal source 310 may be configured to provide a signal to the signal source to alter the varying voltage applied by the signal source 310 to the electrocaloric effect material 305. That is, the temperature calculation unit 320 may compare a calculated change in temperature with an expected or threshold value, and provide a signal to the signal source to alter the applied voltage in a manner to reduce a difference between the calculated change in temperature and the expected or threshold value.

In some examples, however, the temperature calculation unit 320 may not be present, and a signal generated by the capacitance measurement unit 315 indicative of a change in capacitance of the electrocaloric effect material 305 may be used as a proxy for a temperature measurement.

FIG. 4 is a block diagram illustrating an example capacitance measurement unit 315 that is arranged for capacitance measurement in accordance with at least some examples of the present disclosure. The capacitance measurement unit 315 includes the electrocaloric effect material 305 serving as a feedback capacitor, coupled to either end of an amplifier 425. The capacitance measurement unit includes a reference capacitor 420 coupled to the electrocaloric effect material 305. The signal source 310 is positioned to apply a varying voltage across the electrocaloric effect material 305. In this manner, a gain of the capacitance measurement unit 315 is indicative of a capacitance of the electrocaloric effect material 305. Accordingly, by receiving the output voltage for a known input voltage, the capacitance of the electrocaloric effect material 305 may be measured. In some examples, a resistor may be provided between the node 430 and ground (not shown in FIG. 4), which may provide high impedance, low frequency voltage equalization.

Figure 5:
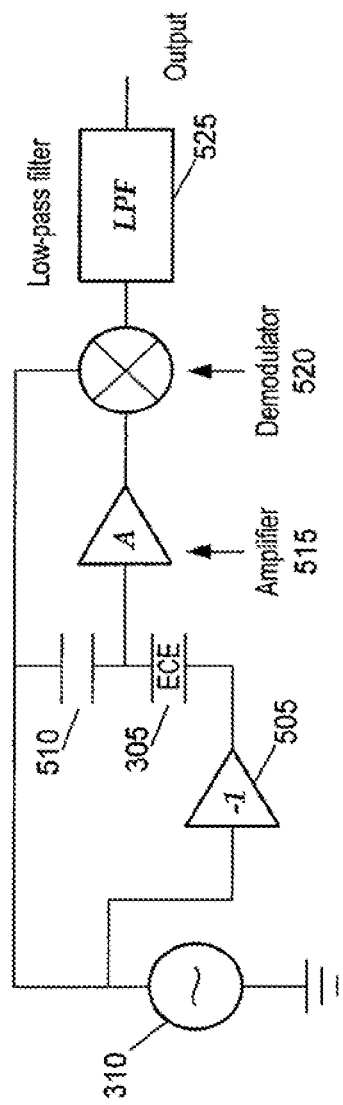
FIG. 5 is a block: diagram illustrating an another example capacitance measurement unit 315 that is arranged for capacitance measurement in accordance with at least some examples of the present disclosure.

FIG. 5 is a block diagram illustrating another example capacitance measurement unit 315 that is arranged for capacitance measurement in accordance with at least some examples of the present disclosure. The capacitance measurement unit 315 may include the signal source 310 and an inverter 505 coupled to provide a varying voltage across the electrocaloric effect material 305 and a reference capacitor 510. An amplifier 515 may be coupled to a node between the electrocaloric effect material 305 and the reference capacitor 510. A demodulator 520 may be coupled to an output of the amplifier and to the signal source 310. A low pass filter 525 may be coupled to the output of the demodulator to generate an output signal indicative of a capacitance of the electrocaloric effect material 305.

The signal source 310 and inverter 505 are arranged to apply a voltage of one polarity to a terminal of the reference capacitor 510, and a same voltage of the opposite polarity to a terminal of the electrocaloric effect material 305. Accordingly, if the electrocaloric effect material has a same capacitance as the reference capacitor 510, the voltage at a node between the reference capacitor and the electrocaloric effect material may be zero. However, there may be a positive or negative voltage at the node between the two when the capacitance of the electrocaloric effect material does not equal that of the reference capacitor.

The voltage at the node between the electrocaloric effect material and the reference capacitor is provided as an input to the amplifier 515, which may amplify the received signal.

The amplified signal may be provided to a demodulator 520 coupled to the signal source 310 to effectively sample the output of the amplifier 515.

Finally, a low pass filter 525 may provide some conditioning, for the output of the demodulator 520, or amplifier 515 in examples where the demodulator 520 may not be present.

Figure 6:
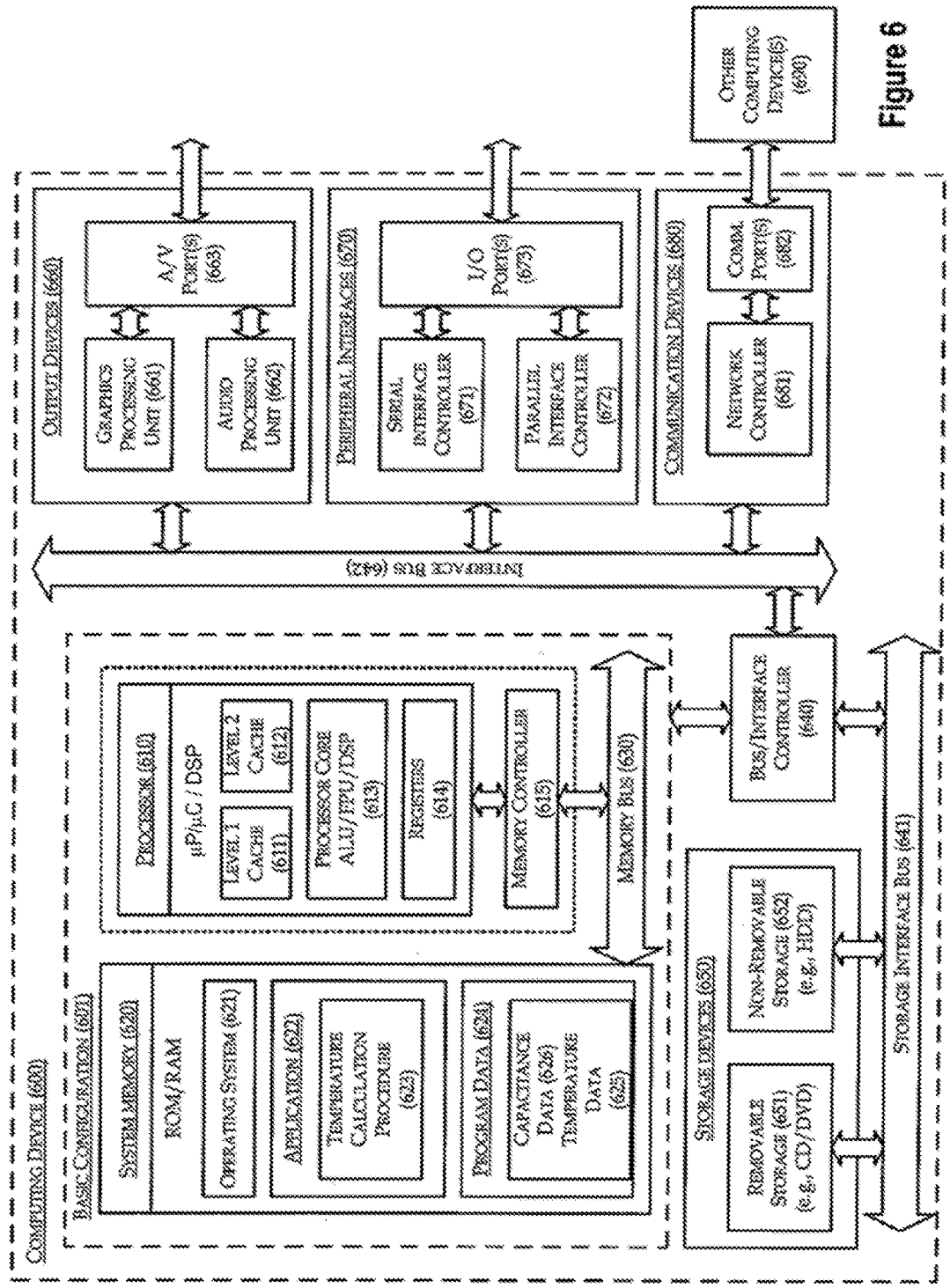
FIG. 6 is a block diagram illustrating an example computing device 600 that is arranged for temperature calculation in accordance with the present disclosure.

FIG. 6 is a block diagram illustrating an example computing device 600 that is arranged for temperature calculation in accordance with the present disclosure. The temperature calculation unit 320 of FIG. 3 may be implemented using all or portions of the computing device 600. In a very basic configuration 601, computing device 600 typically includes one or more processors 610 and system memory 620. A memory bus 630 may be used for communicating between the processor 610 and the system memory 620.

Depending on the desired configuration, processor 610 may be of any type including, but not limited to, a microprocessor (µP), a microcontroller (µC), a digital signal processor (DSP), or any combination thereof. Processor 610 may include one more levels of caching, such as a level one cache 611 and a level two cache 612, a processor core 613, and registers 614. An example processor core 613 may include an arithmetic logic unit (ALU), a floating point unit (FPU), a digital signal processing core (DSP Core), or any combination thereof. An example memory controller 615 may also be used with the processor 610, or in some implementations the memory controller 615 may be an internal part of the processor 610.

Depending on the desired configuration, the system memory 620 may be of any type including but not limited to volatile memory (such as RAM), non-volatile memory (such as ROM, flash memory, etc.) or any combination thereof. System memory 620 may include an operating system 621, one or more applications 622, and program data 624. Application 622 may include a temperature calculation procedure 623 that is arranged to calculate temperature in accordance with examples described above. Program data 624 may include capacitance data received from the capacitance measurement unit 315, temperature data 625 calculated by the computing device 600, or both. In some embodiments, application 622 may be arranged to operate with program data 624 on an operating system 621 such that the capacitance data 626 is converted, into temperature data 625. This described basic configuration is illustrated in FIG. 6 by those components within dashed line 601.

Computing device 600 may have additional features or functionality, and additional interfaces to facilitate communications between the basic configuration 601 and any required devices and interfaces. For example, a bus/interface controller 640 may be used to facilitate communications between the basic configuration 601 and one or more data storage devices 650 via a storage interface bus 641. The data storage devices 650 may be removable storage devices 651, non-removable storage devices 652, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and nonremovable media implemented in any method or technology for storage of information, such as computer readable instructions, data structures, program modules, or other data.

System memory 620, removable storage 651 and non-removable storage 652 are all examples of computer storage media. Computer storage media includes, but is not limited to RAM, ROM, EEPROM, flash memory or other memory technology, CDROM, digital versatile disks (DVD) or other optical storage, magnetic cassettes, magnetic tape, magnetic disk storage or other magnetic storage devices, or any other medium which may be used to store the desired information and which may be accessed by computing device 600. Any such computer storage media may be part of device 600.

Computing device 600 may also include an interface bus 642 for facilitating communication from various interface devices (e.g., output interfaces, peripheral interfaces, and communication interfaces) to the basic configuration 601 via the bus/interface controller 640. Example output devices 660 include a graphics processing unit 661 and an audio processing unit 662, which may be configured to communicate to various external devices such as a display or speakers via one or more A/V ports 663. Example peripheral interfaces 670 include a serial interface controller 671 or a parallel interface controller 672, which may be configured to communicate with external devices such as input devices (e.g., keyboard, mouse, pen, voice input device, touch input device, etc.) or other peripheral devices (e.g., printer, scanner, etc.) via one or more I/O ports 673. An example communication device 680 includes a network controller 681, which may be arranged to facilitate communications with One Or more other computing devices 690 over a network communication link via one or more communication ports 682.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 600 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 600 may also be implemented as a personal computer including both laptop computer and non-laptop computer configurations.

Figure 7:
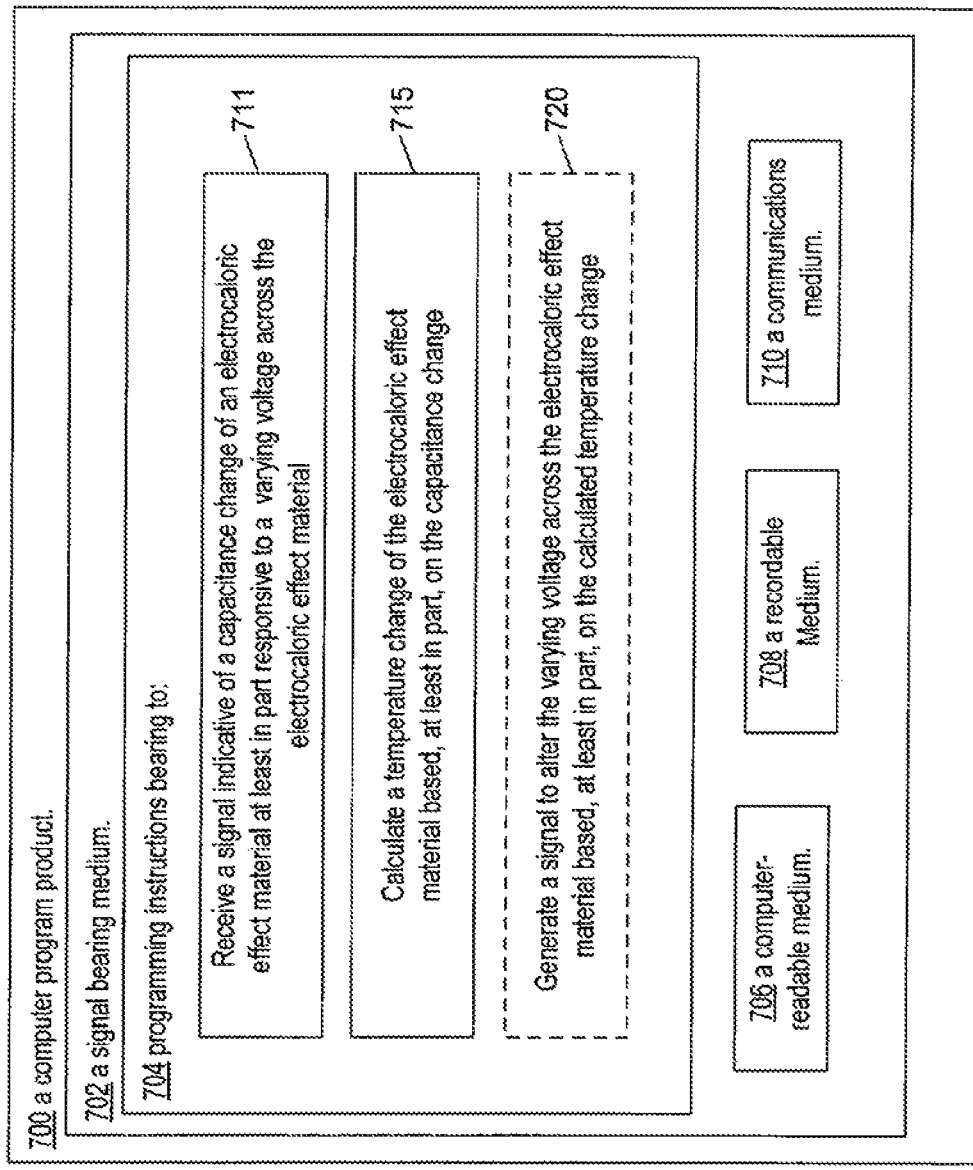
FIG. 7 is a block diagram illustrating an example computer program product 700 that is arranged to store instructions calculating a temperature change based on is change in capacitance of an electrocaloric effect material in accordance with the present disclosure.

FIG. 7 is a block diagram illustrating an example computer program product 700 that is arranged to store instructions calculating a temperature change based on a change in capacitance of an electrocaloric effect material in accordance with the present disclosure. The signal bearing medium 702 which may be implemented as or include a computer-readable medium 706, a recordable medium 708, a communications medium 710, or combinations thereof, stores instructions 704 that may configure the processing unit to perform all or some of the processes previously described. These instructions may include, for example, one or more executable instructions 711 for receiving a signal indicative of a capacitance change of an electrocaloric effect material at least in part responsive to a varying voltage across the electrocaloric effect material. The instructions may include one or more executable instructions 715 for calculating a temperature change of the electrocaloric effect material based, at least in part, on the capacitance change. The instructions may also include one or more executable instructions 720 for generating a signal to alter the varying voltage across the electrocaloric effect material based, at least in part, on the calculated temperature change.

The present disclosure is not to be limited in terms of the particular examples described in this application, which are intended as illustrations of various aspects. Many modifications and examples may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and examples are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course vary. It is also to be understood that the terminology used herein is for the purpose of describing particular examples only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc,). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described, in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a nonlimiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 items refers to groups having 2, or 3 items. Similarly, a group having 1-5 items refers to groups having 1, 2, 3, 4, or 5 items, and so forth.

While the foregoing detailed description has set forth various examples of the devices and/or processes via the use of block diagrams, flowcharts, and/or examples, such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one example, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the examples disclosed herein, in whole or in part, can be equivalently implemented in integrated circuits, as one or more computer programs running on one or more computers (e.g., as one or more programs running on one or more computer systems), as one of more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. For example, if a user determines that speed and accuracy are paramount, the user may opt for a mainly hardware and/or firmware vehicle; if flexibility is paramount, the user may opt for a mainly software implementation; or, yet again alternatively, the user may opt for some combination of hardware, software, and/or firmware.

In addition, those skilled in the art will appreciate that the mechanisms of the subject matter described herein are capable of being distributed as a program product in a variety of forms, and that an illustrative example of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs. One or more interaction devices, such as a touch pad or screen, and/or control systems including feedback loops and control motors (e.g., feedback for sensing position and/or velocity; control motors fur moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mineable and/or physically interacting components and/or wirelessly interactable and/or wirelessly interacting components and/or logically interacting and/or logically interactable components.

While various aspects and examples have been disclosed herein, other aspects and examples will be apparent to those skilled in the art. The various aspects and examples disclosed herein are for purposes of illustration and are not intended to be limiting, with the true scope and spirit being indicated by the following claims.

What is claimed:
1. An electrocaloric effect system comprising:
an electrocaloric effect material;
a signal source positioned to apply a varying voltage across the electrocaloric effect material;
a capacitance measurement unit coupled to the electrocaloric effect material and configured to measure a capacitance of the electrocaloric effect material and further configured to generate a signal indicative of a change in capacitance of the electrocaloric effect material responsive to the varying voltage,
wherein the varying voltage comprises a plurality of discrete pulses having a magnitude between a first reference voltage and a second reference voltage;
wherein the capacitance measurement unit is configured to compare the capacitance of the electrocaloric effect material with a reference capacitance of a reference capacitor; and
a temperature calculation unit coupled to the capacitance measurement unit, wherein the temperature calculation unit is configured to receive the signal indicative of the change in capacitance of the electrocaloric effect material, calculate a change in polarization of the electrocaloric effect material, based at least in part, on the capacitance change, and generate a signal indicative of a temperature change of the electrocaloric effect material based, at least in part, on the change in polarization.

2. The electrocaloric effect system of claim 1, wherein the signal source at least partially includes the capacitance measurement unit.

3. The electrocaloric effect system of claim 1, wherein the capacitance measurement unit comprises a circuit configured to measure a voltage at a node between the electrocaloric effect material and the reference capacitor.

4. The electrocaloric effect system of claim 1, wherein the temperature calculation unit is further coupled to the signal source and configured to alter the varying voltage across the electrocaloric effect material based, at least in part, on a calculated temperature change.

5. The electrocaloric effect system of claim 4, wherein the varying voltage across the electocaloric effect material is altered to reduce a difference between the temperature change and a threshold.

6. The electrocaloric effect system of claim 1, wherein the temperature calculation unit is configured to combine the signal indicative of the change in capacitance with a fixed constant.

7. The electrocaloric effect system of claim 6, wherein the fixed constant is based, at least in part, on a geometry of the electrocaloric effect material.

* * * * *

UNITED STATES PATENT AND TRADEMARK OFFICE
CERTIFICATE OF CORRECTION

| | | |
|---|---|---|
| PATENT NO. | : 9,612,169 B2 | Page 1 of 2 |
| APPLICATION NO. | : 14/303326 | |
| DATED | : April 4, 2017 | |
| INVENTOR(S) | : Kruglick | |

It is certified that error appears in the above-identified patent and that said Letters Patent is hereby corrected as shown below:

In the Specification

In Column 1, Line 27, delete "material," and insert -- material. --, therefor.

In Column 1, Line 30, delete "may he used" and insert -- may be used --, therefor.

In Column 2, Lines 23-24, delete "accompanying, drawings," and insert -- accompanying drawings, --, therefor.

In Column 2, Line 25, delete "In the drawings:".

In Column 2, Lines 35-36, delete "capacitance measure measurement" and insert -- capacitance measurement --, therefor.

In Column 2, Line 39, delete "block: diagram" and insert -- block diagram --, therefor.

In Column 2, Line 49, delete "based on is" and insert -- based on a --, therefor.

In Column 2, Line 55, delete "hereof In" and insert -- hereof. In --, therefor.

In Column 2, Line 65, delete "in as wide" and insert -- in a wide --, therefor.

In Column 3, Line 8, delete "based, at east" and insert -- based, at least --, therefor.

In Column 3, Line 13, delete "material, In" and insert -- material. In --, therefor.

In Column 3, Line 53, delete "thin-fim" and insert -- thin-film --, therefor.

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*

CERTIFICATE OF CORRECTION (continued)
U.S. Pat. No. 9,612,169 B2

In Column 3, Line 65, delete "thin-fim" and insert -- thin-film --, therefor.

In Column 4, Line 6, delete "P is polarization. E is electric, field," and insert -- P is polarization, E is electric field, --, therefor.

In Column 4, Line 25, delete "a draftee in" and insert -- a change in --, therefor.

In Column 4, Line 28, delete "may he" and insert -- may be --, therefor.

In Column 4, Line 50, delete "may he" and insert -- may be --, therefor.

In Column 5, Line 2, delete "or 4.29 V." and insert -- of 4.29 V. --, therefor.

In Column 5, Line 21, delete "signal source 110." and insert -- signal source 310. --, therefor.

In Column 5, Line 51, delete "for USC in" and insert -- for use in --, therefor.

In Column 6, Line 18, delete "elect material" and insert -- effect material --, therefor.

In Column 7, Lines 29-30, delete "conditioning, for" and insert -- conditioning for --, therefor.

In Column 8, Line 2, delete "converted, into" and insert -- converted into --, therefor.

In Column 8, Line 52, delete "with One Or" and insert -- with one or --, therefor.

In Column 10, Line 38, delete "etc,)." and insert -- etc.). --, therefor.

In Column 10, Line 48, delete "described, in" and insert -- described in --, therefor.

In Column 11, Line 1, delete "having 2," and insert -- having 1, 2, --, therefor.

In Column 11, Line 23, delete "one of more" and insert -- one or more --, therefor.

In Column 11, Line 67, delete "motors fur moving" and insert -- motors for moving --, therefor.

In Column 12, Line 25, delete "mineable" and insert -- mateable --, therefor.

In the Claims

In Column 12, Line 53, in Claim 1, delete "capacitor; and" and insert -- capacitor, and --, therefor.

In Column 13, Line 9, in Claim 5, delete "electocaloric" and insert -- electrocaloric --, therefor.